United States Patent [19]

Van Brunt et al.

[11] 4,395,767

[45] Jul. 26, 1983

[54] INTERCONNECT FAULT DETECTOR FOR LSI LOGIC CHIPS

[75] Inventors: Nicholas P. Van Brunt; John H. A. Ketzler, both of White Bear Lake, Minn.

[73] Assignee: Control Data Corporation, Minneapolis, Minn.

[21] Appl. No.: 255,929

[22] Filed: Apr. 20, 1981

[51] Int. Cl.³ .................... G01R 31/28; G06F 11/00
[52] U.S. Cl. .................................... 371/25; 324/73 R
[58] Field of Search ................... 371/25, 15; 324/73 R

[56] References Cited

U.S. PATENT DOCUMENTS

| | | | |
|---|---|---|---|
| 3,657,527 | 4/1972 | Kassabgi et al. | 371/25 |
| 3,851,161 | 11/1974 | Sloop | 371/25 |
| 4,001,818 | 1/1977 | Radichel et al. | 371/25 |
| 4,009,437 | 2/1977 | Lacher | 324/73 R |
| 4,176,258 | 11/1979 | Jackson | 371/25 |
| 4,183,460 | 1/1980 | Yuen et al. | 371/15 |
| 4,220,917 | 9/1980 | McMahon, Jr. | 324/73 R |
| 4,241,307 | 12/1980 | Hong | 324/73 R |
| 4,271,515 | 6/1981 | Axtell et al. | 371/25 |

OTHER PUBLICATIONS

Benowitz et al., An Advanced Fault Isolation System for Digital Logic, IEEE Transactions on Computers, vol. C-24, No. 5, May 1975, pp. 489-497.

*Primary Examiner*—Charles E. Atkinson
*Attorney, Agent, or Firm*—William J. McGinnis; Joseph A. Genovese

[57] ABSTRACT

A large-scale integrated circuit (LSI) chip has an individual voltage level sensing circuit connected with each input and output connecting pin so that isolation between the pins is maintained and so that the individual level sensor output can provide an indication of an abnormal voltage on the input/output pin. The outputs of all level sensors for all input and output pins is connected in common to the input of a comparator circuit. The comparator circuit has a fault detection threshold voltage input and provides a fault indication output signal whenever the voltage input from the level sensor circuits is outside of the detection threshold voltage range. A number of logic chips will have particular input/output pins connected together in a circuit in conventional applications. An open circuit anywhere in the interconnected network will cause some number of input/output pins dependent on the fault location to be pulled out of the detection threshold voltage range. Similarly, any short circuit to ground condition will also cause a voltage shift outside of the detection threshold voltage range. Further, interconnect faults which result in impedance mismatch and cause a "ringing" signal voltage outside of the threshold detection voltage range, will also be detected as a fault signal. Thus, the fault detection system of the present disclosure will detect a number of types of faults in interconnection networks of various logic chips.

9 Claims, 3 Drawing Figures

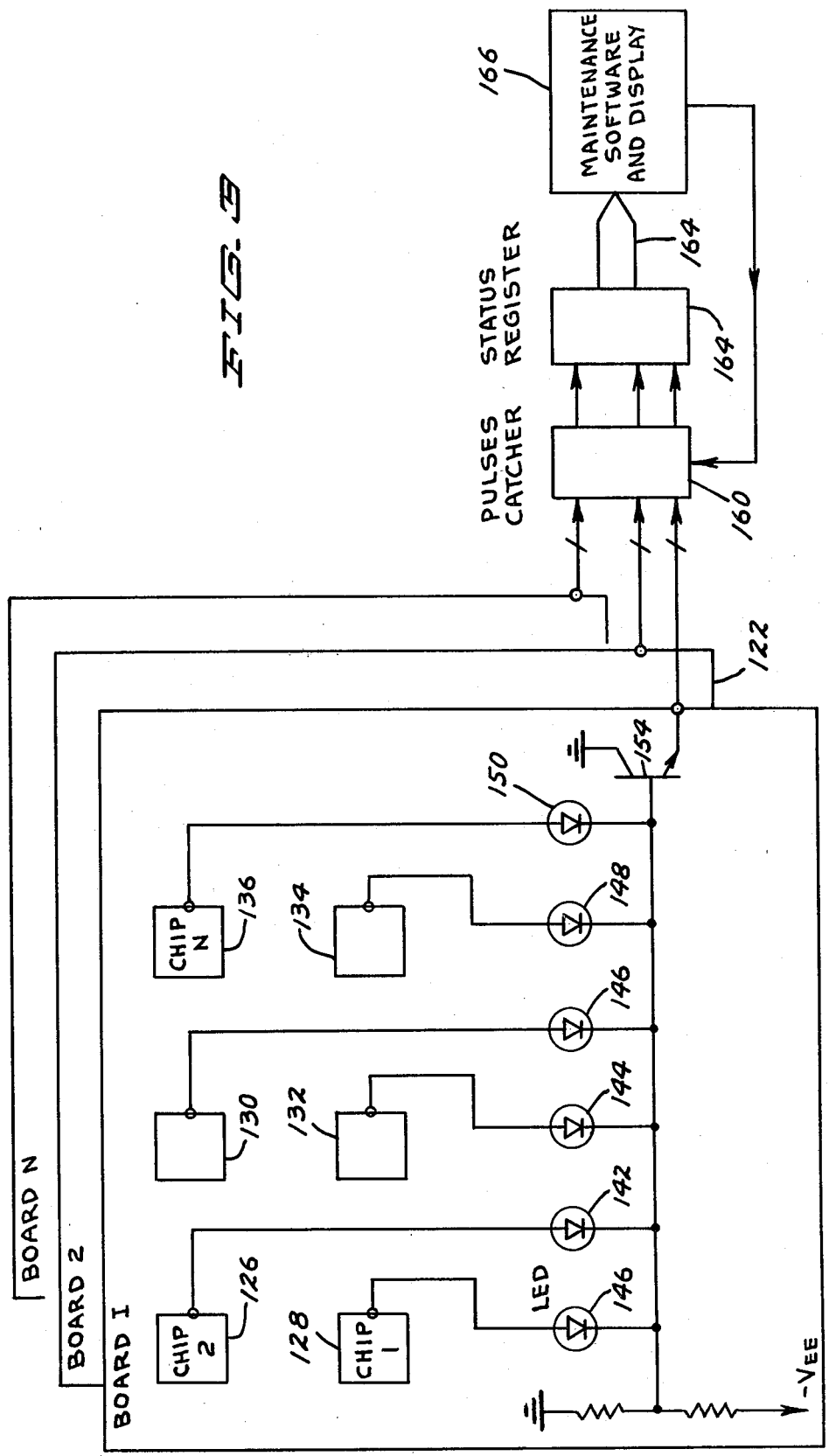

INTERCONNECT FAULT DETECTOR FOR LSI LOGIC CHIPS

BACKGROUND OF THE INVENTION

The present invention relates to a fault detection system which can be incorporated into individual integrated circuit chips. In particular, the fault detector of the present invention can detect internal as well as interconnect faults of various types between integrated circuit chips. A particular application of the present invention is an interconnect fault detector for large-scale integrated circuit (LSI) chips and the system connecting a plurality of such chips.

As the various integrated circuit technologies mature, integrated circuit chips are becoming more reliable. As a result, a large percentage of failure detection mechanisms are shifting attention away from the active circuit area within the chip and focusing additionally on the signal interconnect system for a number of chips on a logic card or on various logic cards. The individual circuit chips are becoming such that manufacturing yield is higher. This is why the interconnect system is a current focus of attention for fault reliability or fault detection. Because of the increasing user pressure to improve reliability of products incorporating such chips, a means of detecting a substantial number of the interconnect related failure modes in a system is required. A primary goal of such an interconnect fault detection system is that it can operate simultaneously and continuously with the intended normal circuit operations and functions.

There are several U.S. Patents which are pertinent to the present invention. Perhaps the most pertinent patent known is U.S. Pat. No. 4,183,460 which is directed to a test circuit for current mode logic (CML) chips. The present invention is directed to emitter coupled logic (ECL) chips. There is therefore a clear difference between the present invention and the way it operates in connection with ECL circuits and the patented invention and the way it deals with CML circuits. First, referring to the patent, each chip has a separate input open detector in a separate configuration from the output short detector. The present invention shows a common voltage level sensor circuit used with both output pins and input pins of ECL chips.

Also, the input open detector of the patented invention requires more than one reference voltage to operate. In the present invention, a single reference voltage is applied in connection with all level sensors associated with either input pins or output pins on a chip. Referring to FIG. 2 of the patented invention, the detecting circuit consisting of transistors T3 and T4 undergoes a switching operation as voltage swings from high to low values. The voltage level sensor of the present invention consists of a single transistor device which does not undergo a switching function during voltage swings. The fault detecting function of the patented invention occurs with a switching operation between transistors T5 and T6 shown in FIG. 2 and is represented as a comparison between two different reference voltages. The present invention uses a plurality of level sensors associated with pins on a chip and in which each level sensor device is connected to a fault detect logic bus which is finally connected with a comparator circuit which receives the input reference voltage. The single comparator circuit functions to provide a fault detection report when appropriate.

Thus, the present invention shows a single comparing circuit employing the reference voltage while the patented invention shows a comparing function associated with a transistor switching operation for each input pin and in which the distribution of reference voltages must be made to each such input open detector. The present invention enjoys the advantage the distribution of reference voltages needs to be made to only a single device per chip. There are numerous other differences but it is clear that the present invention is different from the patented invention. It is believed that the present invention provides for a considerable improvement in efficiency in fault detection on LSI chips where a common level sensor circuit can be used for input and output pins and in which a common comparator functions for fault detection for all circuits on the chip. More such differences will become apparent from reading the following specification of the present invention.

One of the reasons that a single circuit design which performs both the open and the short detection functions on inputs as well as outputs represents a significant improvement in connection with the present invention is as follows. Recall first that U.S. Pat. No. 4,183,460 requires a different circuit for short detection than that which performs open detections. In the present invention in which use with gate array integrated circuits is contemplated, the level sensors can be integrated into the gate array matrix before the customized metallization layers are applied to the circuit. Thus, the level sensor circuits according to the present invention which are the same for input pins as for output pins can be created in the chip prior to the definition of exactly which pins will become, in the final circuit, input pins and which will become output pins. The patented invention requires a determination at the beginning the manufacturing process of which pins will become input pins or output pins. Thus the present invention enjoys the advantage of greater flexibility in chip design. Further, there is better utilization of the silicon area in a chip according to the present invention because no extra work is required for logic designers or for automatic placement and routing software tools in chip fabrication because all input and output pins are treated the same regardless of function. In the present invention it is not necessary to detect shorts between two output pins as in the patented invention. This is because it is common to tie output pins of ECL logic gates together to form logical "AND" or "OR" functions of the connected outputs. These events should not be flagged as a short circuit because they are intentional. However, it is still necessary to retain the function of determining if there is a short to ground condition. The present invention accomplishes this end result. The invention in U.S. Pat. No. 4,183,460 only accomplishes the short to ground detection function in connection with the short between two output pin function.

Another pertinent patent is U.S. Pat. No. 4,176,258. The subject patent shows an error checking system which is designed primarily to check the logic of various chips. If the outputs from a first chip and a second chip are checked with respect to one another, an error signal is generated if the two signals do not correspond. Thus, the system is designed to check logic rather than input and output levels or such things as short circuits and open circuits. In fact, if both chips as shown in the subject patent had the same signal, even if erroneous, no error signal would be generated. The present invention, however, generates an error detection signal for short circuits or open circuits or an impedance mismatch signal sufficient to generate a ringing signal outside of the error threshold. Such a signal could of course be generated even if the logic components of a chip were working properly.

U.S. Pat. Nos. 3,851,161; 4,009,437 and 4,241,307 show various test and analysis schemes related to chip interconnections or continuity testing methods. However, all of these patents are related to schemes involving a logic module not in its normal operating mode but in some special test mode. The present invention relates to an error detection system which functions on a logic module while in a conventional operating mode providing a useful logic function in a system. Thus, the subject patents do not anticipate the present invention because the function is related only to a test mode. In addition, none of the three referenced patents shows a single level sensor circuit associated with each input and output pin on a chip all of which are connected to a single comparator per chip to provide a fault detection signal.

SUMMARY OF THE INVENTION

The present invention is a continuously operating fault detection monitoring system for all input and output interconnect pins on individual LSI chips. The system has a level sensor on each individual chip in the system for each input and output pin. Therefore, for an interconnect network connecting with a number of LSI chips, a number of different level sensors will be monitoring the same interconnect line. Each interconnect line has a termination impedance at a predetermined voltage level. The individual level sensors for the individual input/output pins on each LSI chip are connected to one or more comparison networks, as determined by design choice, each of which is provided with a detection threshold voltage input. When the output of a level sensor associated with an input/output pin varies from the threshold detection voltage of the comparator, a fault report signal is generated. An open circuit anywhere in the interconnect network will cause some number of input/output pins dependent on the fault location to be pulled towards a voltage outside of the normal operating range as a result of the impedance of the level sensor. This condition is reported as a fault detected. Similarly, any short to ground condition within the interconnect network will cause a voltage shift which will be reported as a fault detected. Certain types of interconnect faults which result from a high impedance connection will cause a "ringing" signal in the interconnect network. This ringing signal can be detected frequently if any peak of the ringing voltage falls outside the threshold range and causes actuation of the comparator. This typically occurs with the most significant interconnect faults having the greatest impedance mismatch and therefore the greatest likelihood of producing error signals in the interconnect system.

A particular advantage of the present invention is that the same level sensor circuit may be used with both input pins and output pins. Thus the fault detection system may be designed on a gate array type chip base where particular chips may vary as to individual pin functions.

Normally, by noting the pattern of LSI chips reporting an error detection or fault report signal, the chips involved can be determined, which in many cases determines the particular interconnect system having an error. By increasing the number of comparators per chip and the number of fault output detect lines per chip where each comparator will receive level sensor signals from fewer input/output pins on each chip, a more complex pattern of fault detection signals can be created which will more nearly determine the location of any particular fault. The system could be generated in an embodiment so as to have an individual comparator for each level sensor and input/output pin combination.

In addition, for example, individual comparators could be connected through level shifters to drive a light emitting diode (LED) to provide a visible indication of a fault for a person troubleshooting a given device. Obviously, various combinations of intensity of interconnect fault detection can be provided in any system depending upon the critically of that system. Therefore, it is possible that a given computer might have different levels of interconnect fault detection in different portions of the computer.

IN THE FIGURES

FIG. 3 is a schematic diagram of an application of the present invention with respect to various logic chips according to the present invention.

DESCRIPTION OF THE PREFERRED EMBODIMENT

The present invention is discussed by way of example with reference to an ECL (emitter coupled logic) logic system commonly found in LSI logic systems used in digital computers. Obviously, the concepts of the present invention may be employed with different voltage ranges for different or related logic systems.

Figure 1:
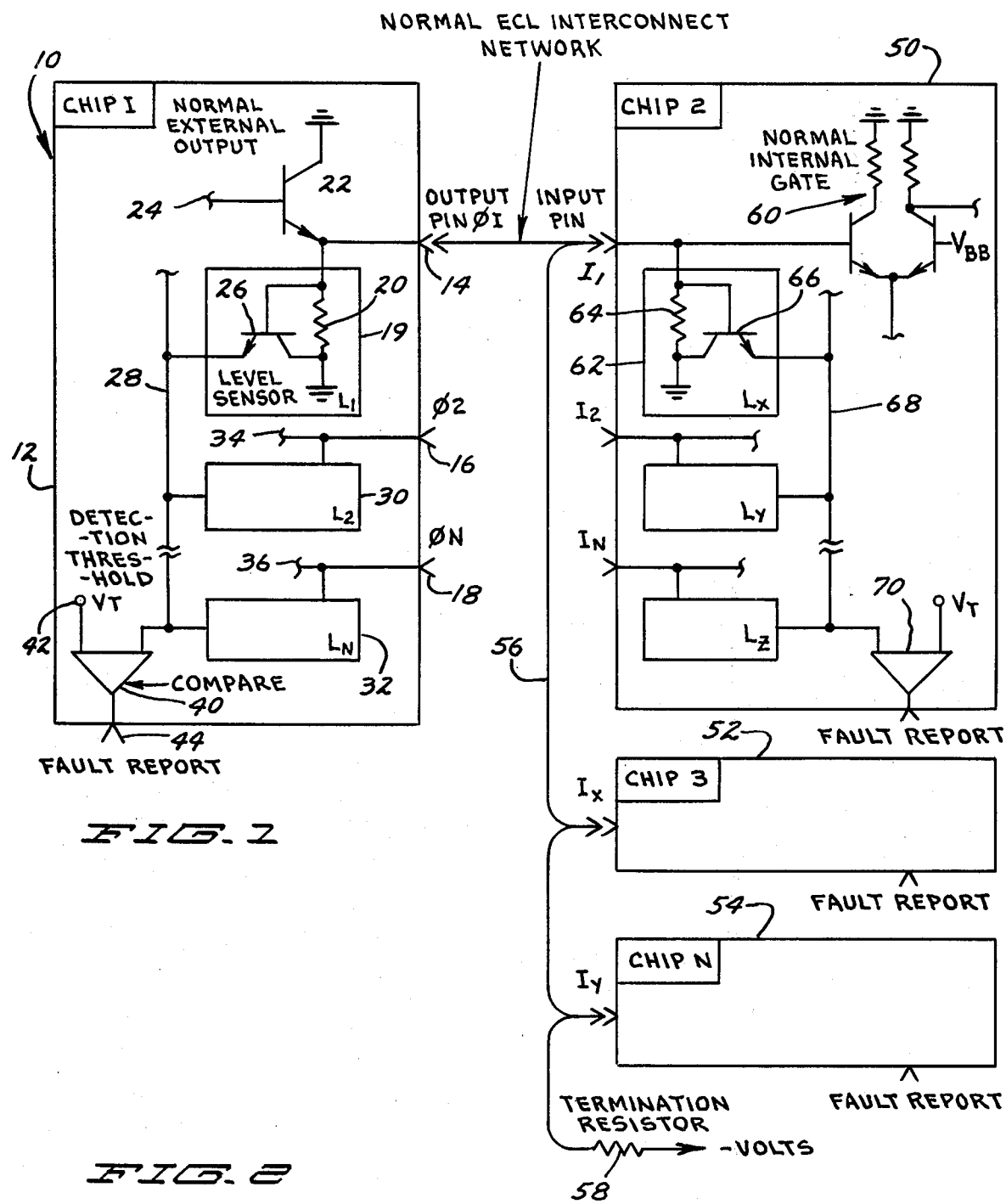
FIG. 1 is a schematic diagram of a fault detection system according to the present invention in a large-scale integrated circuit interconnect network with a number of differnt circuit chips included.

Referring now to FIG. 1, a logic system 10 incorporating individual LSI chips according to the present invention is shown. Logic chip 12 contains a number of input/output pins 14, 16 and so forth up to the Nth pin 18. Each input or output pin is associated with an individual voltage level sensor which contains an internal impedance 20 which may be in the form of a simple resistance. The impedance 20 is referenced to ground from the input or output pin. The normal, logic, external output to the pin is shown in the general sense as an emitter coupled transistor 22 which receives some logic input signal represented by the symbol 24. The level sensor is comprised, for example, of a transistor 26 having its base connected to the interconnect logic level and its collector connected to a ground reference. The emitter of the level sensing transistor is connected to a fault detect logic bus 28 which is similarly connected to other level sensors on the logic chip level sensors 30 and 32 on the logic chip. These additional level sensors associated with pins each of which has a normal logic connection, shown again, by the symbols 34 and 36, respectively. The fault detection logic bus 28 is shown connected with up to N different input/output connections. The bus is provided as the compare input to a comparator 40. A detection threshold voltage input 42 is provided as the reference input to the comparator. The comparator output 44 is an interconnect pin which carries a fault report output signal.

Other chips in the system such as chips 50, 52, and so on through the Nth chip 54 are similarly connected in a particular interconnect network having a connection bus 56 for a particular pin interconnect combination. The interconnect bus 56 has a termination impedance 58 which may be a resistance. The termination impedance is referenced to a voltage level which, for example, in this case may be −2 volts.

Chip 50 similarly has conventional internal logic gates shown representatively by gate 60 of the type to be associated in this logic system. Similarly, level sensors are provided for each input and output pin on gates 50, 52 and 54. Again, level sensor 62 is similar to level sensor 19 in having an internal impedance 64 and a transistor gate 66 which provides an output level sensing signal to a fault detection bus 68. Similarly, a comparator 70 provides a fault detection output. The other logic chips are similar.

Thus, an interconnect network 56 is comprised of a controlled impedance path containing connectors, coax cable, printed circuit strip lines or twisted pair connections to interconnect various logic chips. The termination impedance at the end of the connection path is provided to be essentially equal to the path impedance so that impedance is properly matched throughout the circuit. The failure modes of these types of interconnects and logic systems is typically that of an open circuit or of a short to ground. If any interconnect components, including the termination impedance either opens or shorts to ground, a non-logic voltage level will appear on the interconnection path which will be detected by one or more of the monitoring circuits. Because of the high number of gates as compared to the number of input/output pins of LSI circuits, this can be a very economical and effective technique of fault detection and isolation.

Normal logic levels in a typical ECL logic system are in the range of −0.7 to −1.8 volts. An open circuit anywhere in the interconnect network will cause some number of chip pins, dependent on the fault location, to be pulled towards zero volts by the resistances, such as 20 and 64, in each level sensor. This condition is sensed by comparison against a detection threshold voltage and reported by comparators, such as 40 and 70. Any short to ground condition causes a similar voltage shift and is detected in the same way. Interconnect faults of the sort which cause a large impedance mismatch and therefore a ringing signal when the signal crosses the impedance mismatched path, will also be detected if the peak voltage of the ringing oscillation signal exceeds the threshold voltage.

Figure 2:
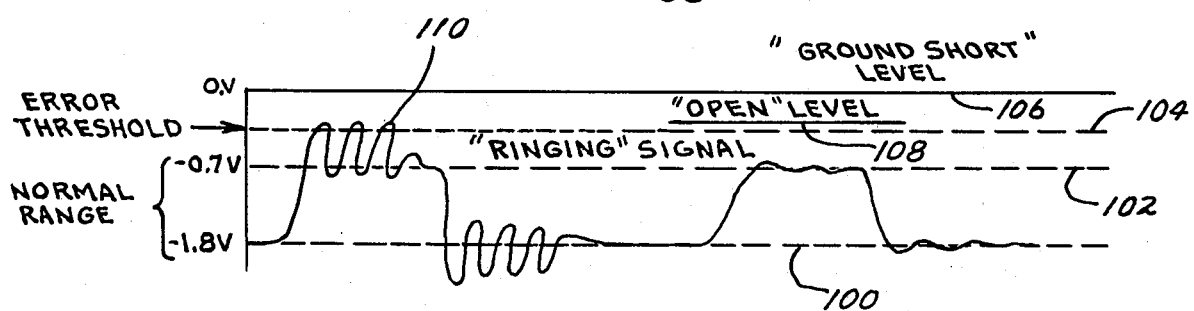
FIG. 2 is a diagram of the various voltage conditions which will occur on an LSI interconnect network according to one embodiment of the present invention.

Referring now to FIG. 2, the normal range of voltages in an ECL logic circuit is shown as having a lower level 100, an upper level 102 and an error threshold level of 104. Typically, a ground short circuit level will produce a zero volt signal on interconnect path at 106, above the threshold voltage. Similarly, an open circuit someplace in the interconnect path will produce an open level voltage 108 at some voltage outside the threshold voltage level but different from zero volts. A ringing signal caused by an impedance mismatch in the interconnect path is shown, for example, at 110 where the peaks of the ringing signal cross the error threshold voltage level 104 to cause a fault detection condition.

Referring now to FIG. 3, a complete system of the sort which might be found in a large digital computer is shown having a number of circuit boards 120, 122 and 124. Each board contains a number of logic chips 126, 128, 130, 132, 134 up to the Nth chip 136. In this embodiment of the invention, the output of each individual chip on a circuit board is provided to an LED 140, 142, 144, 146, 148 and 150, respectively. Thus, if there is a fault on a given board, the chip causing the fault or having the fault will have a visible LED indication of the involved chip. The LEDs are supplied with a supply voltage on a supply bus 152 from a voltage source. The supply bus is connected with a level shifting circuit 154. The level shifting circuit works with the OR function generated by the LEDs to produce an output signal if any one of the chips on the board has a fault. The LEDs naturally provide an OR function as any conventional diode does. Individual outputs from the individual circuit boards are connected to individual inputs to a pulse catcher network 160 which in turn provides an output to a status register 162. The status register provides an output 164 to the computer maintenance software and display system schematically shown as 166.

If, for example, a given chip on a given board has a fault, it will light its associated LED and produce an output pulse for the board. The board output pulse will pass into the pulse catcher which will identify on the status register the particular board having a fault. A maintenance person will locate the appropriate board in the computer and note on the board the particular LED which is giving a fault indication and in that way readily find a given logic chip which needs to be replaced or which needs to have its interconnect network serviced. If a plurality of boards and chips simultaneously have a fault condition detected, a proper diagnostic approach could clearly accomplish a great deal towards showing the specific pin interconnect system at fault.

What is claimed is:

1. A logic circuit interconnect fault detection system comprising:
    a first logic circuit chip containing conventional logic circuits connected with input and output pins,
    at least one voltage level sensing circuit on said first logic circuit chip associated with one of the connecting pins of said first logic circuit chip,
    a comparator on said first logic circuit chip having a first input connected with the output of said voltage level sensing circuit, having a second input for receiving a reference voltage as the fault detection threshold input and the output of said comparator connected to an output pin of said first logic circuit chip, said comparator output being a fault indication signal,
    a second logic circuit chip containing conventional logic circuits connected with input and output pins,
    at least one voltage level sensing circuit on said second logic circuit chip associated with one of the connecting pins of said second logic circuit chip,
    a comparator on said second logic circuit chip having a first input connected with the output of said voltage level sensing circuit, having a second input for receiving a reference voltage as the fault detection threshold input and the output of said comparator connected to an output pin of said second logic circuit chip said comparator output being a fault indication signal,
    a plurality of interconnect systems between particular input and output pins of said first and second chips, at least one interconnect system including at least one pin on said first or second chip having a voltage level sensing circuit and a termination impedance for each interconnect system said impedance having a termination reference voltage level.

2. The system of claim 1 wherein every input and output pin on said first and second logic circuit chips has an individual voltage level sensing circuit and wherein every voltage level sensing circuit on said first logic circuit chip is connected to said comparator on said first logic circuit chip and, further, wherein every input and output pin on said second logic circuit chip has an individual voltage level sensing circuit and wherein every voltage level sensing circuit on said second logic circuit chip is connected to said comparator on said second logic circuit chip.

3. The system of claim 2 and further comprising additional logic circuit chips each having voltage level sensing circuits connected with each input and output pin and a comparator on each of said additional logic circuit chips connected with every voltage level sensing circuit on said chip wherein some of said interconnect systems connect between the input and output pins of more than two of said logic circuit chips.

4. The system of any one of claims 1, 2 or 3 in which each of said voltage level sensing circuits is comprised of:
a transistor having its base connected to an associated logic circuit chip pin, its collector connected to a common reference level and its emitter connected to said comparator and
a resistance connected between said base and said collector.

5. An interconnect fault detection system comprised of:
a plurality of circuit boards 1 through N each containing a plurality of logic chips 1 through M,
each of said logic chips containing a plurality of level sensors, one of which is connected to each input and output pin and at least one comparator having a first input connected to the outputs of said level sensors and a second input for connection to a reference voltage, the output of said comparator being provided to a fault output of said chip for indicating that at least one of said level sensors is outside the reference voltage input so that each chip has at least one fault indication output,
an OR means on each board connecting all of the fault indicating outputs of each chip on the board to at least one OR gate which provides a fault indication for the particular board,
a pulse catcher means connected to the individual fault outputs of each logic board,
a status register connected with the output of the pulse catcher, and
a maintenance system providing for diagnostic surveillance of the circuit boards in a logic system so that the status register will give an individual unique indication for each circuit board having an output fault indication.

6. The system of claim 5 wherein each of said logic chips containing a level sensor and comparator is comprised as follows:
a logic circuit chip containing conventional logic circuits connected with input and output pins,
a plurality of voltage level sensing circuits, one of which is connected with each of said input and output pins on said logic circuit chip,
a voltage comparator on said logic circuit chip receiving as a first input a reference voltage and as a second input a common input from all of said voltage level sensing circuits, said comparator producing a fault detection output signal when said input from said voltage level sensing circuits is outside the threshold determined by said reference voltage input.

7. The system of claim 6 in which each of said voltage level sensing circuits is comprised of:
a transistor having its base connected to an associated logic circuit chip pin, its collector connected to a common reference level and its emitter connected to said comparator and
a resistance connected between said base and said collector.

8. A logic circuit chip fault detection system for use with an operatively connected logic circuit chip at the same time said circuit chip is in use and comprised of:
a plurality of identical voltage level sensing circuits, one of said voltage level sensing circuits being provided on said chip for each of the input and output pins on said logic circuit chip,
at least one voltage comparator on said chip, said voltage comparator being connected with a plurality of voltage level sensing circuits, said chip having every voltage level sensing circuit connected with a voltage comparator, said comparator having an output,
a reference voltage input to said voltage comparator so that if any voltage level sensing circuit associated with said comparator detects a voltage outside of the voltage threshold set by said reference voltage, said comparator produces a signal at said output representative of a fault indication.

9. The system of claim 8 in which each voltage level sensing circuit is comprised of:
a transistor having its base connected to an associated logic circuit chip pin, its collector connected to a common reference level and its emitter connected to said comparator and
a resistance connected between said base and said collector.

* * * * *